(12) United States Patent
Hong

(10) Patent No.: US 7,705,688 B2
(45) Date of Patent: Apr. 27, 2010

(54) PERIOD SIGNAL GENERATOR OF SEMICONDUCTOR INTEGRATED CIRCUIT

(75) Inventor: Yun-Seok Hong, Ichon (KR)

(73) Assignee: Hynix Semiconductor Inc. (KR)

(*) Notice: Subject to any disclaimer, the term of this patent is extended or adjusted under 35 U.S.C. 154(b) by 24 days.

(21) Appl. No.: 12/107,700

(22) Filed: Apr. 22, 2008

(65) Prior Publication Data

US 2009/0058539 A1 Mar. 5, 2009

(30) Foreign Application Priority Data

Sep. 3, 2007 (KR) .................. 10-2007-0088978

(51) Int. Cl.
*H03L 1/00* (2006.01)
*H03B 5/12* (2006.01)

(52) U.S. Cl. .................. 331/176; 331/48; 365/222
(58) Field of Classification Search .............. 331/176, 331/48; 365/222; 368/202
See application file for complete search history.

(56) References Cited

U.S. PATENT DOCUMENTS

| 6,304,517 B1* | 10/2001 | Ledfelt et al. ............ 368/10 |
| 6,809,980 B2 | 10/2004 | Schnabel et al. |
| 7,038,968 B2 | 5/2006 | Kim |
| 7,120,549 B2 | 10/2006 | Lee |
| 7,164,614 B2 | 1/2007 | Kim |

FOREIGN PATENT DOCUMENTS

| JP | 01205788 | 8/1989 |
| JP | 2006031860 | 2/2006 |
| KR | 1020030078705 A | 10/2003 |
| KR | 100626915 | 9/2006 |

* cited by examiner

*Primary Examiner*—Joseph Chang
(74) *Attorney, Agent, or Firm*—Baker & McKenzie LLP

(57) ABSTRACT

A period signal generator comprises a first period signal generating unit for generating a first period signal of which period changes according to a temperature, a second period signal generating unit for generating a second period signal which has a constant period regardless of a temperature, and a period signal output control unit for comparing the first period signal with the second period signal and selecting and outputting the first period signal in case that the period of the first period signal is shorter than that of the second period signal.

19 Claims, 4 Drawing Sheets

PERIOD SIGNAL GENERATOR OF SEMICONDUCTOR INTEGRATED CIRCUIT

CROSS-REFERENCES TO RELATED APPLICATION

The present application claims priority under 35 U.S.C. 119(a) to Korean application number 10-2007-0088978, filed on Sep. 3, 2007, in the Korean Patent Office, which is incorporated by reference in its entirety as if set forth in full.

BACKGROUND OF THE INVENTION

1. Technical Field

The embodiments described herein relate to a semiconductor integrated circuit and, more particularly, to a period signal generator for use in a semiconductor integrated circuit.

2. Related Art

A conventional semiconductor memory device records data in a memory cell or outputs the data recorded in the memory cell. Such a semiconductor memory device has a refresh operation mode, which is necessary in order to prevent the loss of the data recorded in the memory cell. The refresh operation mode is classified into a self refresh mode, which operates in the semiconductor memory device itself, and an auto-refresh mode, which operates according to a command from outside of the semiconductor memory device.

A self refresh while is periodically performed in a conventional semiconductor memory device, while the auto-refresh does not operate periodically. Rather, the auto-refresh operates only when the command is received from outside of the semiconductor memory device. Therefore, the semiconductor memory device needs a period signal to set the timing of a self refresh operation. Such a period signal is called a self refresh signal and is generated in the semiconductor memory device. The period of the self refresh signal is often changed according to the ambient temperature to increase the efficiency of the self refresh operation. A TCSR (Temperature Compensated Self Refresh) oscillator is used for such changes.

As shown in FIG. 1, the TCSR oscillator increases the time period of a pulse signal as the temperature decreases. Such a pulse signal is used as the self refresh signal in a conventional semiconductor memory device. As shown in FIG. 1, the period of the self refresh signal can be increased excessively below a specific temperature, for example, 37° C. (commonly referred to as a room temperature or a cold temperature in the semiconductor circuit design technology), which can cause the self refresh operation to not be performed.

SUMMARY

A semiconductor integrated circuit capable of changing a period of a self refresh signal for the effective self refresh operation and preventing the period of a self refresh signal from being excessively increased for the stable self refresh operation is described herein. The period of the refresh signal can be variable based on the temperature condition. Since the period of the refresh signal is prevented from being excessively increased below a specific temperature, it is possible to obtain an effective and stable self refresh operation with the improvement of the reliability of the semiconductor integrated circuit.

According to one aspect, a period signal generator comprises a first period signal generating unit for generating a first period signal of which period changes according to a temperatures, a second period signal generating unit for generating a second period signal that has a constant period regardless of a temperatures, and a period signal output control unit for comparing the first period signal with the second period signal and selecting and outputting the first period signal in case that the period of the first period signal is shorter than that of the second period signal.

According to another aspect, a period signal generator comprises a first period signal generating unit for generating a first period signal of which the period changes according to a temperatures a second period signal generating unit for generating a second period signal that has a constant period regardless of a temperatures, a first frequency dividing unit for dividing an output of the first period signal generating unit to output a first divided period signals, a second frequency dividing unit for dividing an output of the second period signal generating unit to output a second divided period signals, and a period signal output control unit for comparing the first divided period signal with the second divided period signal and selecting and outputting the first divided period signal when the period of the first period divided signal is shorter than that of the second period divided signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
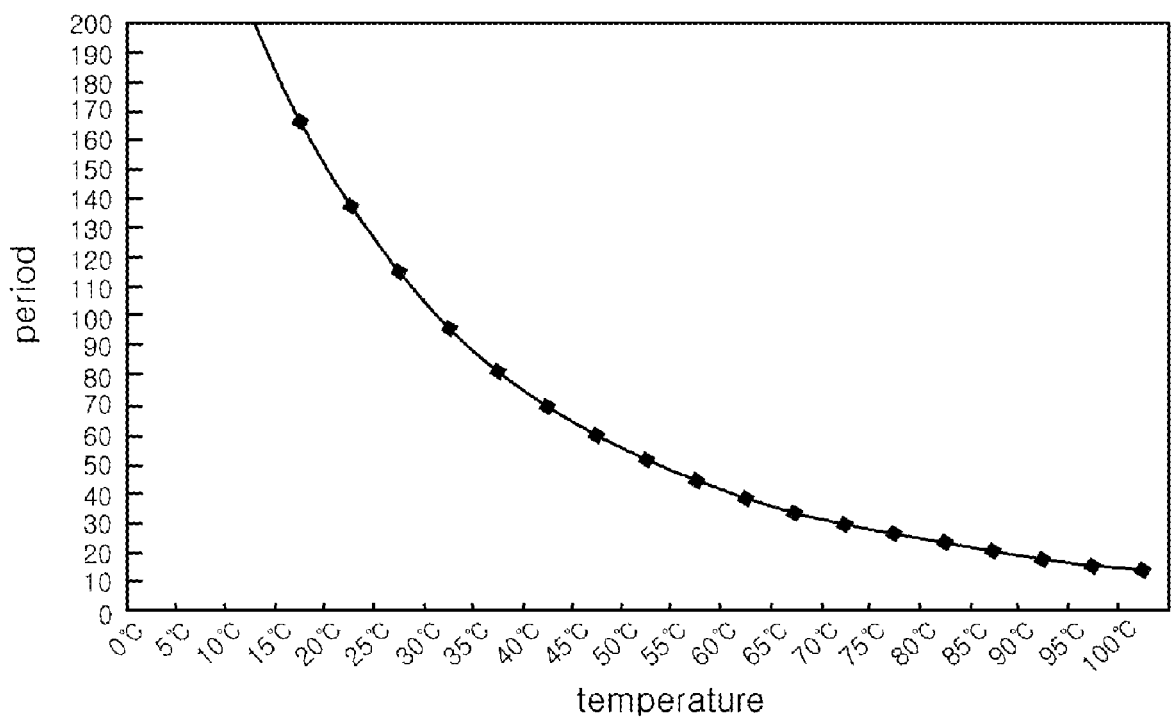
FIG. 1 is a graph of a period variation of an exemplary self refresh signal.
Figure 2:
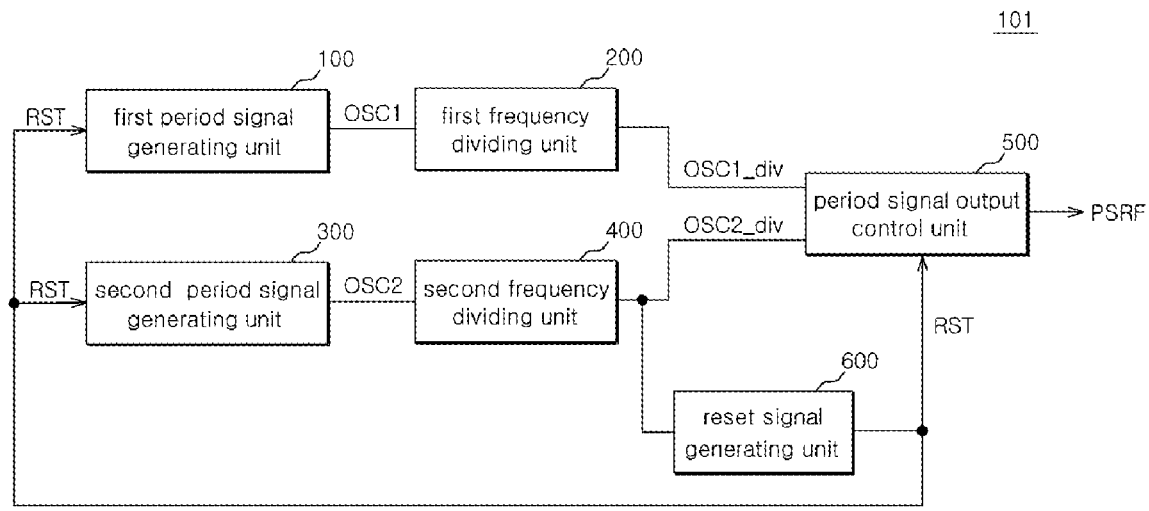
FIG. 2 is a block diagram of a period signal generator that can be included in a semiconductor integrated circuit, according to one embodiment.

FIG. 2 is a diagram illustrating an example period signal generator 101 configured in accordance with one embodiment. As shown in FIG. 2, the period signal generator 101 can include a first period signal generating unit 100, a first frequency dividing unit 200, a second period signal generating unit 300, a second frequency dividing unit 400, a period signal output control unit 500 and a reset signal generating unit 600.

The first period signal generating unit 100 can be configured to start operating in response to a reset signal (RST) to generate a first period signal 'OSC1' of which the period changes according to a temperature. The first period signal generating unit 100 can include a TCSR (Temperature Compensated Self Refresh) oscillator.

The first frequency dividing unit 200 can be configured to divide the first period signal 'OSC1' in a predetermined division ratio (for example, 8:1) to output a first divided period signal 'OSC1_div'.

The second period signal generating unit 300 can be configured to start operating in response to the reset signal 'RST' to generate a second period signal 'OSC2' which can have a constant period regardless of a temperature. The second period signal generating unit 300 can include an EMRS (Extended Mode Register Set) oscillator.

The second frequency dividing unit 400 can be configured to divide the second period signal 'OSC2' in a predetermined division ratio (for example, 16:1) to output a second divided period signal 'OSC2_div'.

The reset signal generating unit 600 can include a counter configured to generate the reset signal 'RST' at a predetermined period (for example, 320 ms). The reset signal generating unit 600 can be further configured to divide the second period signal 'OSC2' or the second divided period signal 'OSC2_div' in a predetermined division ratio to generate the reset signal 'RST'.

The period signal output control unit 500 can be configured to compare the first divided period signal 'OSC1_div' with the second divided period signal 'OSC2_div'. When the period of the first divided period signal 'OSC1_div' is not longer than that of the second divided period signal 'OSC2_div', the period signal output control unit 500 can be configured to select the first divided period signal 'OSC1_div' for use in generating a self refresh signal 'PSRF'.

Figure 3:
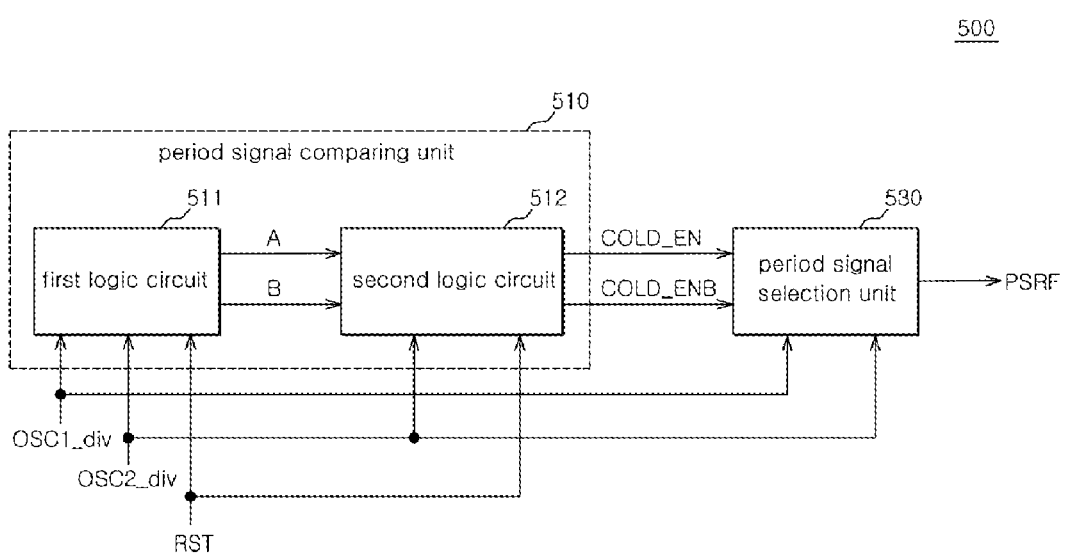
FIG. 3 is a block diagram of a period signal output control unit that can be included in the period signal generator illustrated in FIG. 2.

As illustrated in FIG. 3, the period signal output control unit 500 can include a period signal comparing unit 510 and a period signal selection unit 530. The period signal comparing unit 510, which can include a first logic circuit 511 and a second logic circuit 512, can be configured to compare the timing of generation of the first divided period signal 'OSC1_div' with the timing of generation of the second divided period signal 'OSC2_div', and then output control signals 'COLD_EN' and 'COLD_ENB' to select one of the first divided period signal 'OSC1_div' and the second divided period signal 'OSC2_div'.

Figure 4:
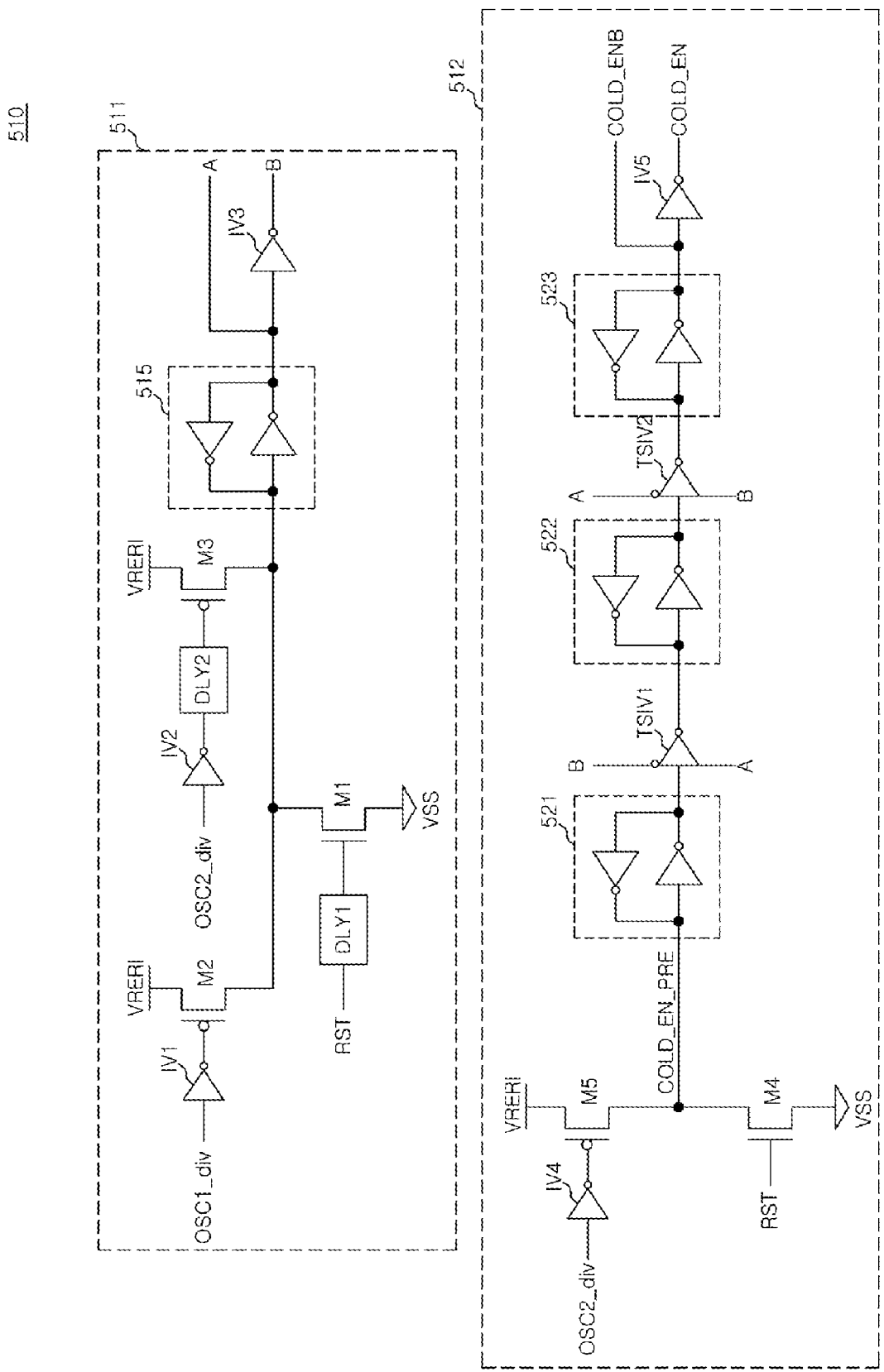
FIG. 4 is a circuit diagram of a period signal comparing unit that can be included in the period signal output control unit illustrated in FIG. 3.

As shown in FIG. 4, the first logic circuit 511 can be configured to initialize comparison signals 'A' and 'B' in response to the reset signal 'RST' and change the levels of the comparison signals 'A' and 'B' in response to the first divided period signal 'OSC1_div' and the second divided period signal 'OSC2_div'.

The first logic circuit 511 can include first to third inverters IV1 to IV3, first and second delay elements DLY1 and DLY2, first to third transistors M1 to M3, and a first latch 515. The first delay element DLY1 can receive the reset signal 'RST'. The source of the first transistor M1 can be connected to a ground terminal (VSS), and an output of the first delay element DLY1 can be coupled to the gate of the first transistor M1. The first inverter IV1 can receive the first divided period signal 'OSC1_div'. The source of the second transistor M2 can be connected to a power source terminal (VRERI), and an output of the first inverter IV1 can be coupled to the gate of the second transistor M2. The second inverter IV2 can receive the second divided period signal 'OSC2_div'.

The second delay element DLY2 can receive the output of the second inverter IV2. The source of the third transistor M3 can be connected to the power source (VRERI), and an output of the second delay element DLY2 can be coupled is inputted to the gate of the third transistor M3. The drains of the first to third transistors M1 to M3 can be connected. The input terminal of the first latch 515 is connected to the drain of the third transistor M3. The input terminal of the third inverter IV3 can be connected to the output terminal of the first latch 515. Further, the delay time of the first delay element DLY1 can be set to be the same as that of the second delay element DLY2.

As shown in FIG. 4, the second logic circuit 512 can be configured to generate the control signals 'COLD_EN' and 'COLD_ENB' using the pre-control signal 'COLD_EN_PRE' which can have a voltage level corresponding to the reset signal 'RST' or a voltage level corresponding to the second divided period signal 'OSC2_div', according to the transition timing of the comparison signals 'A' and 'B'.

The second logic circuit 512 can include fourth and fifth inverters IV4 and IV5, fourth and fifth transistors M4 and M5, second to fourth latches 521 to 523, and first and second tristate inverters TSIV1 and TSIV2.

The source of the fourth transistor M4 can be connected to the ground terminal (VSS), and the gate of the fourth transistor M4 can receive the reset signal 'RST'. The fourth inverter IV4 can receive the second divided period signal 'OSC2_div'. The source of the fifth transistor M5 can be connected to the power source (VRERI), and the gate of the fifth transistor M5 can receive the output of the fourth inverter IV4. The input terminal of the second latch 521 can be connected to the drain of the fourth and fifth transistors M4 and M5. The input terminal of the first tristate inverter TSIV1 can be connected to the output terminal of the first latch 521, and the control terminals of the first tristate inverter TSIV1 can receive the comparison signals 'A' and 'B'.

The input terminal of the third latch 522 can be connected to the output terminal of the first tristate inverter TSIV1. The input terminal of the second tristate inverter TSIV2 is connected to the output terminal of the third latch 522, and the control terminals of the second tristate inverter TSIV2 can receive the comparison signals 'A' and 'B'.

The input terminal of the fourth latch 523 can be connected to the output terminal of the second tristate inverter TSIV2, and the input terminal of the fifth inverter IV5 can be connected to the output terminal of the fourth latch 523.

Figure 5:
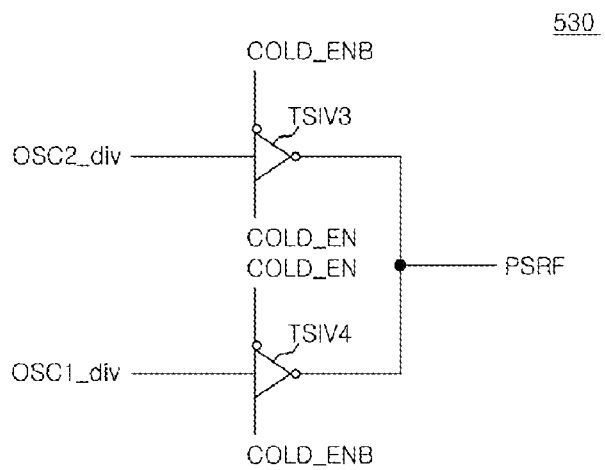
FIG. 5 is a circuit diagram of a period signal selection unit that can be included in the period signal comparing unit illustrated in FIG. 3.

As shown in FIG. 5, the period signal selection unit 530 can select one of the first divided period signal 'OSC1_div' and the second divided period signal 'OSC2_div' according to the control signals 'COLD_EN' and 'COLD_ENB' and output the selected signal as the self refresh signal 'PSRF'.

The period signal selection unit 530 can include third and fourth tristate inverters TSIV3 and TSIV4. The input terminal of the third tristate inverter TSIV3 can receive the second divided period signal 'OSC2_div' and the control terminals of the third tristate inverter TSIV3 can receive the control signals 'COLD_ENB' and 'COLD_EN'. The input terminals of the fourth tristate inverter TSIV4 can receive the first divided period signal 'OSC1_div' and the control terminals of the fourth tristate inverter TSIV4 can receive the control signals 'COLD_ENB' and 'COLD_EN'. The output terminal of the fourth tristate inverter TSIV4 can be connected to the output terminal of the third tristate inverter TSIV3.

The first frequency dividing unit 200 and the second frequency dividing unit 400 can be used to change the output signals of the first period signal generating unit 100 and the second period signal generating unit 300 to be within the range of a comparable frequency, respectively; however, they are not indispensable to the embodiments described herein. Thus, if the output signals of the first period signal generating unit 100 and the second period signal generating unit 300 are within the range of the comparable frequency, it is possible not to use the first frequency dividing unit 200 and the second frequency dividing unit 400.

The operation of the period signal generator 101 will now be described.

The period signal generator 101 operates to prevent excessive increase of the period of the self refresh signal 'PSRF' below a specific temperature, for example, 37° C. (commonly referred to as a room temperature or a cold temperature in the semiconductor circuit design technology) and to change the period of the self refresh signal 'PSRF' for an efficient self refresh operation at above 38° C.

First, when the temperature is above 37° C., for example 90° C. (commonly referred to as a hot temperature in the semiconductor circuit design technology), the period signal generator 101 will operate as follows: First, the reset signal generating unit 600 generates the reset signal 'RST' periodically, for example, with a time period of 320 ms. When the reset signal 'RST' is generated, the first period signal generating unit 100, the second period signal generating unit 300, and the period signal output control unit 500 begin operating.

The first period signal generating unit 100 outputs the first period signal 'OSC1' and the second period signal generating unit 300 outputs the second period signal 'OSC2'. The first frequency dividing unit 200 and the second frequency dividing unit 400 divide the first period signal 'OSC1' and the second period signal 'OSC2' to output the first divided period signal 'OSC1_div' and the second divided period signal 'OSC2_div', respectively.

When the reset signal 'RST' is generated, the first logic circuit 511 of the period signal output control unit 500, shown in FIG. 4, outputs the comparison signals 'A' and 'B' in high and low levels, respectively, and the second logic circuit 512 outputs the pre-control signal 'COLD_EN_PRE' in a low level. Since the comparison signals 'A' and 'B' are in high and low levels, respectively, a low level pre-control signal 'COLD_EN_PRE' passes through the first tristate inverter TSIV1 to be latched in the third latch 522.

Figure 6:
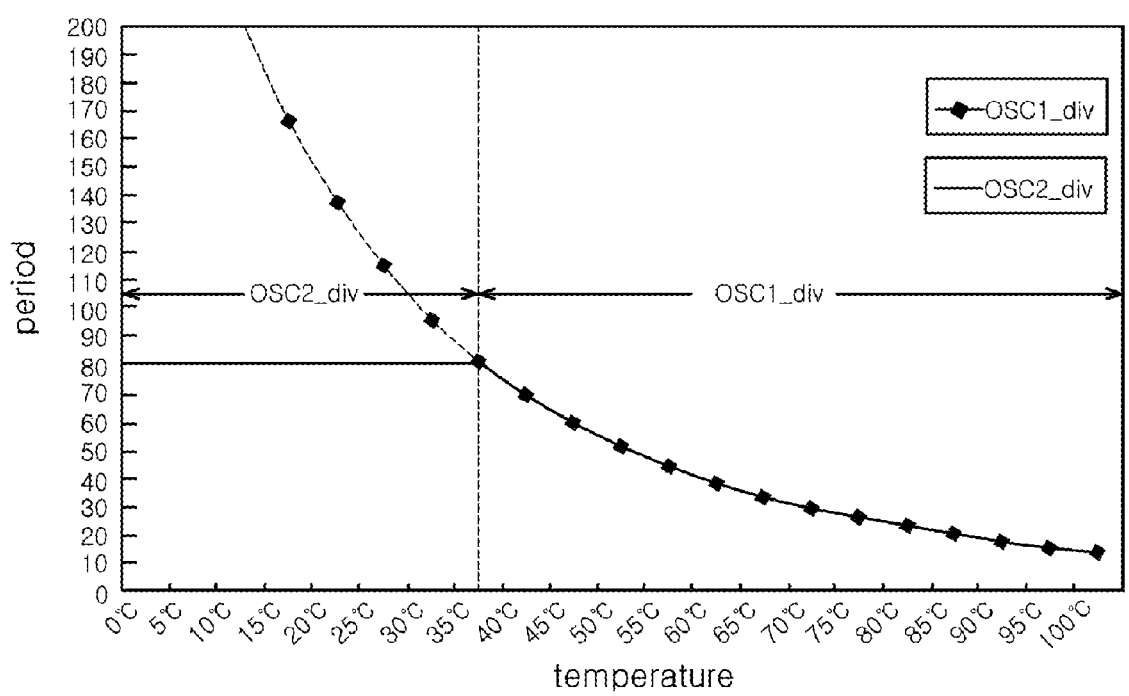
FIG. 6 is a graph of a period variation of a self refresh signal generated using the period signal generator of FIG. 2.

Since the current temperature is 90° C., the period of the first divided period signal 'OSC1_div' is shorter than that of the second divided period signal 'OSC2_div', as shown in FIG. 6. That is, the pulse of the first divided period signal 'OSC1_div' is generated earlier than that of the second divided period signal 'OSC2_div'.

Therefore, after the reset signal 'RST' is generated, the second transistor M2 of the first logic circuit 511 is turned on so that the voltage levels of the comparison signals 'A' and 'B' are changed into low and high levels, respectively.

Since the levels of the comparison signals 'A' and 'B' are changed into low and high levels, respectively, the pre-control signal 'COLD_EN_PRE' of the second logic circuit 512 passes through the second tristate inverter TSIV2 to be latched in the fourth latch 523 and the control signals 'COLD_EN' and 'COLD_ENB' are output in low and high levels, respectively.

Since the control signals 'COLD_EN' and 'COLD_ENB' are output in low and high levels, respectively, the first divided period signal 'OSC1_div' passes through the period signal selection unit 530 to be output as the self refresh signal 'PSRF', as shown in FIG. 5.

Meanwhile, when the temperature is below 37° C. (a cold temperature), the operation is as follows: First, the reset signal generating unit 600 generates the reset signal 'RST' periodically, for example, with a time period of 320 ms. When the reset signal 'RST' is generated, the first period signal generating unit 100, the second period signal generating unit 300 and the period signal output control unit 500 begin operating.

The first period signal generating unit 100 outputs the first period signal 'OSC1' and the second period signal generating unit 300 outputs the second period signal 'OSC2'. The first frequency dividing unit 200 and the second frequency dividing unit 400 divide the first period signal 'OSC1' and the second period signal 'OSC2' to output the first divided period signal 'OSC1_div' and the second divided period signal 'OSC2_div', respectively.

When the reset signal 'RST' is generated, the first logic circuit 511 of the period signal output control unit 500, shown in FIG. 4, outputs the comparison signals 'A' and 'B' in high and low levels, respectively.

Since the current temperature is 30° C., the period of the second divided period signal 'OSC2_div' is shorter than that of the first divided period signal 'OSC1_div', as shown in FIG. 6. That is, the pulse of the second divided period signal 'OSC2_div' is generated earlier than that of the first divided period signal 'OSC1_div'.

Therefore, the fifth transistor M5 of the second logic circuit 512 is turned on so that the level of the pre-control signal 'COLD_EN_PRE' is changed to a high level. Since the comparison signals 'A' and 'B' are in high and low levels, respectively, a high level pre-control signal 'COLD_EN_PRE' passes through the first tristate inverter TSIV1 to be latched in the third latch 522.

Since the level of the pre-control signal 'COLD_EN_PRE' is high and the third transistor M3 is turned on after the delay time of the second delay element DLY2 of the first logic circuit 511, the levels of the comparison signals 'A' and 'B' are changed to low and high levels, respectively.

Since the levels of the comparison signals 'A' and 'B' are changed to low and high levels, respectively, a high level pre-control signal 'COLD_EN_PRE' passes through the second tristate inverter TSIV2 to be latched in the fourth latch 523 and the control signals 'COLD_EN' and 'COLD_ENB' are output in high and low levels, respectively.

Since the control signals 'COLD_EN' and 'COLD_ENB' are output in high and low levels, respectively, the second divided period signal 'OSC2_div' passes through the period signal selection unit 530 to be output as the self refresh signal 'PSRF', as shown in FIG. 5.

As described above, the period signal generator 101 outputs the first divided period signal 'OSC1_div' as the self refresh signal 'PSRF' at above a specific temperature (37° C.) and outputs the second divided period signal 'OSC2_div' as the self refresh signal 'PSRF' at below 37° C. Accordingly, at a high temperature, the first divided period signal 'OSC1_div', of which period changes according to a temperature, is used as the self refresh signal 'PSRF' so that an efficient self refresh operation is possible, and at a low temperature, the second divided period signal 'OSC2_div', which has a constant period, is used as the self refresh signal 'PSRF' so that the excessive increase of the period of the self refresh signal 'PSRF' is prevented.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A period signal generator of a semiconductor integrated circuit, comprising:
  a first period signal generating unit for configured to generate a first period signal the period of which changes according to a temperature;
  a second period signal generating unit configured to generate a second period signal that has a constant period regardless of a temperature; and a period signal output control unit having a period signal comparing unit configured to compare the pulse generation timing of the first period signal with that of the second period signal and output control signals to select one of the first period signal and the second period signal, and a period signal selection unit coupled with the period signal comparing unit, the period signal selection unit configured to select and output one of the first period signal and the second period signal according to the control signals.

2. The period signal generator of claim 1, wherein the first period signal generating unit includes a TCSR (Temperature Compensated Self Refresh) oscillator.

3. The period signal generator of claim 1, wherein the second period signal generating unit includes an oscillator configured to generate the second period signal, and wherein the second period signal has the period of a MRS (Mode Register Set) signal.

4. The period signal generator of claim 1, wherein the period signal comparing unit includes:
   a first logic circuit configured to initialize comparison signals in response to a reset signal and change the levels of the comparison signals in response to the first period signal and the second period signal at a predetermined interval; and
   a second logic circuit coupled with the first logic circuit, the second logic circuit configured to generate the control signals using a pre-control signal having a voltage level corresponding to the reset signal or to the second period signal according to the timing of the level change of the comparison signals.

5. The period signal generator of claim 4, wherein the first logic circuit includes:
   a first switch element configured to initialize the comparison signals in response to the reset signal at a first predetermined interval;
   a second switch element configured to change the levels of the initialized comparison signals in response to the first period signal; and
   a third switch element configured to change the levels of the initialized comparison signals in response to the second period signal at a second predetermined interval.

6. The period signal generator of claim 5, wherein the first switch element is further configured to initialize the comparison signals by connecting the comparison signals to a ground terminal in response to the reset signal, and wherein the second and third switch elements are configured to change the levels of the comparison signals by connecting the comparison signals to a power source terminal in response to the first period signal and the second period signal, respectively.

7. The period signal generator of claim 5, wherein the first predetermined interval is equal to the second predetermined interval.

8. The period signal generator of claim 5, wherein the first logic circuit further includes a latch connected to the output terminal of the first switch element, the output terminal of the second switch element, and the output terminal of the third switch element.

9. The period signal generator of claim 4, wherein the second logic circuit includes:
   a first switch element configured to initialize the pre-control signal in response to the reset signal;
   a second switch element configured to change the level of the pre-control signal in response to the second period signal;
   a third switch element configured to pass the pre-control signal in response to the initialized comparison signals; and
   a fourth switch element configured to pass an output of the third switch element to output the control signals when the levels of the comparison signals are changed.

10. The period signal generator of claim 9, wherein the first switch element is configured to initialize the control signals by connecting the control signals to the ground terminal in response to the reset signal, and wherein the second switch element is configured to change the levels of the control signals by connecting the control signals to a power source terminal in response to the second period signal.

11. The period signal generator of claim 9, wherein the second logic circuit further includes a plurality of latches, each of the plurality of latches configured to store each of the outputs of the first switch element to the fourth switch element.

12. The period signal generator of claim 1, wherein the period signal selection unit includes:
   a first switch element configured to pass the second period signal in response to the control signals; and
   a second switch element configured to pass the first period signal in response to the control signals.

13. The period signal generator of claim 1, further comprising a frequency dividing unit configured to divide at least one of an output of the first period signal generating unit and an output of the second period signal generating unit.

14. The period signal generator of claim 4, further comprising a reset signal generating unit configured to generate the reset signal.

15. The period signal generator of claim 14, wherein the reset signal generating unit includes a counter.

16. A period signal generator of a semiconductor integrated circuit, comprising:
   a first period signal generating unit configured to generate a first period signal the period of which changes according to a temperature;
   a second period signal generating unit configured to generate a second period signal that has a constant period regardless of a temperature;
   a first frequency dividing unit coupled to the first period signal generating unit, the first frequency dividing unit configured to divide an output of the first period signal generating unit to output a first divided period signal;
   a second frequency dividing unit coupled to the second period signal generating unit, the second frequency dividing unit configured to divide an output of the second period signal generating unit to output a second divided period signal; and
   a period signal output control unit coupled with the first and second frequency dividing units, the period signal output control unit configured to compare the first divided period signal with the second divided period signal and select and output the first divided period signal when the period of the first period divided signal is shorter than that of the second period divided signal, or select and output the second divided period signal if the period of the second period divided signal is shorter than that of the first period divided signal,
   wherein the period signal output control unit includes:
   a period signal comparing unit configured to compare the pulse generation timing of the first divided period signal with that of the second divided period signal and output control signals to select one of the first divided period signal and the second divided period signal; and a period signal selection unit configured to select and output one of the first divided period signal and the second divided period signal according to the control signals.

17. The period signal generator of claim 16, wherein the first period signal generating unit includes a TCSR (Temperature Compensated Self Refresh) oscillator.

18. The period signal generator of claim 16, wherein the second period signal generating unit includes an oscillator configured to generate the second period signal having the period of a MRS (Mode Register Set) signal.

19. The period signal generator of claim 16, wherein the period signal comparing unit includes:

a first logic circuit configured to initialize comparison signals in response to a reset signal and change the levels of the comparison signals in response to the first divided period signal and the second divided period signal at a predetermined interval; and a second logic circuit configured to generate the control signals using one of a pre-control signal having a voltage level corresponding to the reset signal and a pre-control signal having a voltage level corresponding to the second period signal according to the timing of the level change of the comparison signals.

* * * * *